(12) United States Patent
Cha et al.

(10) Patent No.: US 6,387,747 B1
(45) Date of Patent: May 14, 2002

(54) METHOD TO FABRICATE RF INDUCTORS WITH MINIMUM AREA

(75) Inventors: Randall Cha, Singapore (SG); Tae Jong Lee, Orlando, FL (US); Alex See, Singapore (SG); Lap Chan, San Francisco, CA (US); Chua Chee Tee, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/867,561

(22) Filed: May 31, 2001

(51) Int. Cl.⁷ ............................................. H01L 21/8244

(52) U.S. Cl. ...................... 438/238; 438/381; 438/687

(58) Field of Search ................................ 438/238, 381, 438/619, 687

(56) References Cited

U.S. PATENT DOCUMENTS

| 5,478,773 | A | 12/1995 | Dow et al. ................... 437/60 |
| 5,539,241 | A | 7/1996 | Abidi et al. ................. 257/531 |
| 5,717,243 | A | 2/1998 | Lowther ..................... 257/531 |
| 5,793,096 | A | 8/1998 | Yu et al. ..................... 257/531 |
| 6,054,329 | A | 4/2000 | Burghartz et al. ............. 438/3 |
| 6,187,647 | B1 * | 2/2001 | Chu ........................... 438/238 |
| 6,309,922 | B1 * | 10/2001 | Liu et al. .................... 438/238 |

* cited by examiner

Primary Examiner—Jey Tsai
(74) Attorney, Agent, or Firm—George O. Saile; Rosemary L. S. Pike

(57) ABSTRACT

A method for forming an RF inductor of helical shape having high Q and minimum area. The inductor is fabricated of metal or damascened linear segments formed on three levels of intermetal dielectric layers and interconnected by metal filled vias to form the complete helical shape with electrical continuity.

29 Claims, 9 Drawing Sheets

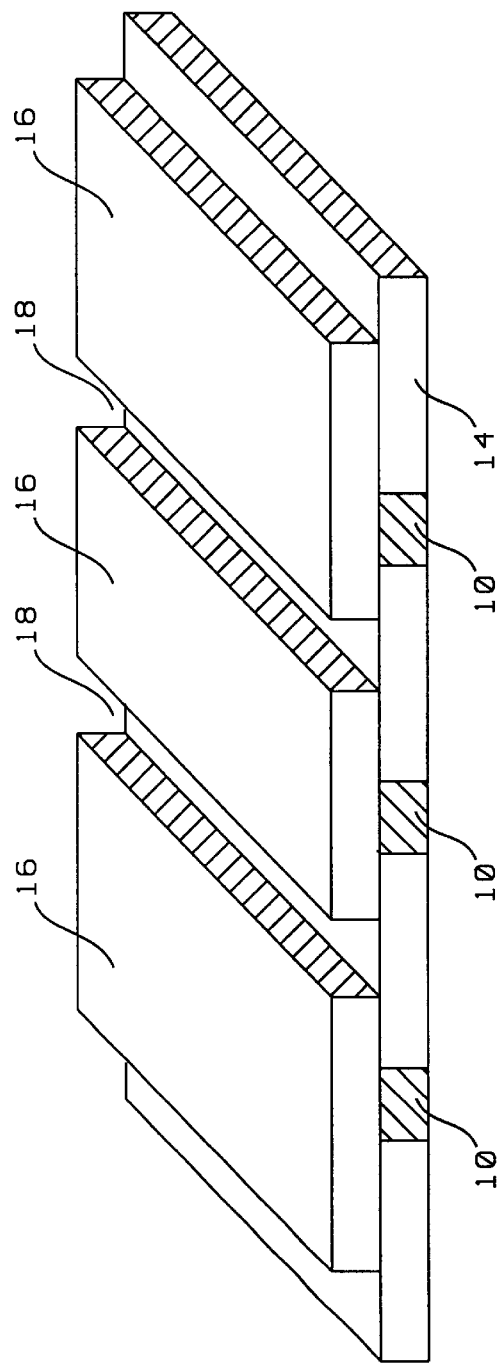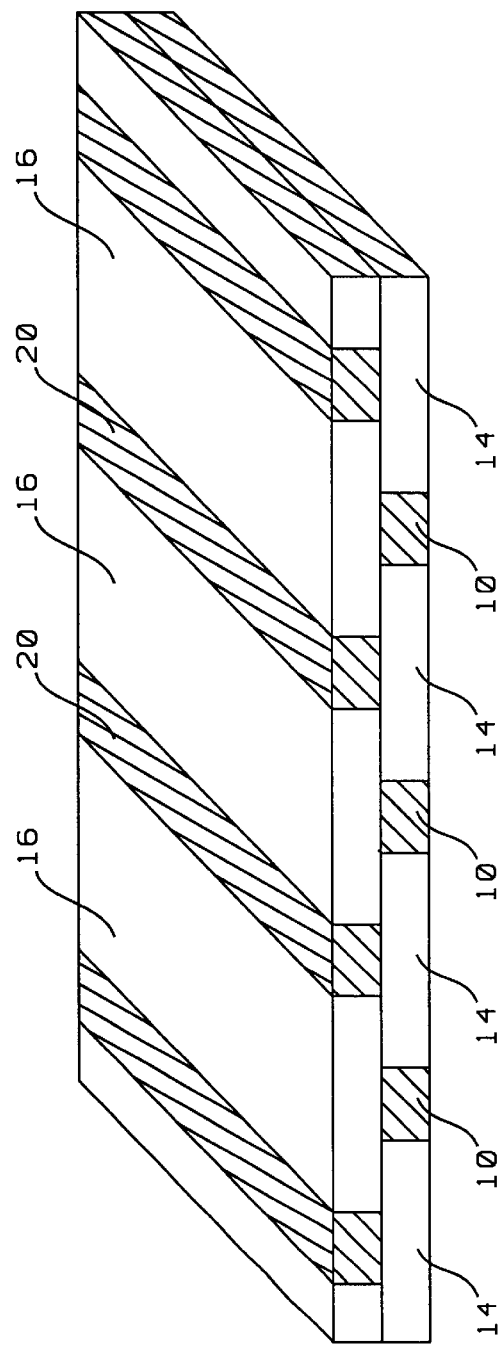

METHOD TO FABRICATE RF INDUCTORS WITH MINIMUM AREA

BACKGROUND OF THE INVENTION

1. Field of the Invention

This invention relates generally to the fabrication of integrated microelectronic circuitry having passive circuit components formed therein, more specifically to such a circuit having an inductor formed therein.

2. Description of the Related Art

It is well known that fabricating microelectronics circuitry, wherein active and passive components are monolthically integrated, is advantageous both from the standpoint of reducing manufacturing costs and from the standpoint of producing a circuit with improved operating characteristics. When considering methods of forming such passive components, however, inductors pose more challenges than either resistors or capacitors. For the purposes that they are required, microelectronic inductors must have both a high inductance (eg. to reduce power consumption) and high quality factor (Q factor.) Quality factor is defined as the ratio of energy stored to energy dissipated (Es/Ed) by a device, which can be shown to be equal to Im(Z)/Re(Z), the ratio of the imaginary part of the impedance, Z, and its real part. Generally, the imaginary part, Im(Z), is the reactance of the device, which, for a device having both capacitative as well as inductive characteristics is given by the difference between the inductive reactance and the capacitative reactance at the frequency of operation, $\Omega$:

$$Im(Z) = \omega L - 1/\omega C.$$

The real part, Re(Z), is determined by the sum of the inductor's resistive losses, which we can simply call R. Thus:

$$Q = (\omega L - 1/\omega C)/R.$$

For an inductor with little or no capacitative component, the Q is simply $\omega L/R$.

When the inductor is formed as a monolithic structure within a larger integrated fabrication, the capacitance and resistive parts include effects due to coupling between the inductor and its surroundings, ie. parasitic effects. Burghartz et al. (U.S. Pat. No. 6,054,329) discloses a damascened spiral and toroidal inductor wherein the spiral inductor is planar and the toroidal inductor is spirally formed around a ferromagnetic core. Dow et al. (U.S. Pat. No. 5,478,773) provides a plated copper integrated planar spiral inductor, wherein the inductor is contained within a square area of 410 microns on a side and has an inductance of 50 nH (nanoHenries) and a Q factor of 15 or greater. Yu et al. (U.S. Pat. No. 5,793,096) discloses an inductor device with MOS transistors installed therein. Lowther (U.S. Pat. No. 5,717,243) discloses a spiral inductor that is formed over a semiconductor device substrate. The Q value of the inductor is increased by a formation wherein circumferential parasitic currents are channeled through doped regions of the substrate, reducing its resistance and lowering the real part of its impedance. Abidi et al. (U.S. Pat. No. 5,539,241) provides an integrated circuit with an energy storing inductor which is monolithically formed within an oxide layer overlaying a silicon substrate. To reduce parasitic capacitances, an opening is formed within the silicon substrate beneath the inductor and filled with an insulating material to effectively isolate the inductor.

Conventional planar inductors suffer from several disadvantages which adversely affect both their inductance and their Q factor. To provide a high inductance, they must have a large number of windings and a cover a correspondingly large area. This, however, produces sizeable parasitic capacitances as well as increased energy dissipation within the underlying substrate. In order to increase Q while not reducing L requires an inductor that covers a smaller area for a given number of windings. In addition, a planar spiral produces much of its magnetic field within the substrate, which induces oppositely directed fields that reduce the inductance of the coil. On the other hand, a helical or solenoidal shaped inductor confines more of its magnetic field within the coil formation, thus improving its inductive characteristics. For this reason, a helical inductor occupying a small area would be an optimal formation for an inductor with large L and high Q.

SUMMARY OF THE INVENTION

It is an object of the present invention to provide a method for forming, within a minimum area of an integrated microelectronics fabrication, an RF inductor having a large inductance and high quality factor.

It is a further object of the present invention to provide a method for forming such an inductor wherein there is minimal capacitative coupling and significantly reduced cross-talk between adjacent levels of metallization such as that associated with coils and interconnects.

It is yet a further object of the present invention to provide a method for forming such a minimum area RF inductor in a manner that does not involve the etching of formations with high aspect ratios.

It is yet a further object of the present invention to provide a method for forming such a minimum area RF inductor in a manner that is easily and efficiently implemented within current fabrication processes for microelectronics circuitry.

It is yet a further object of the present invention to provide a coil structure having large inductance and high quality factor together with increased versatility of circuit placement and a corresponding broader range of applicability within the constraints of circuit design.

The above objects of the present invention will be realized by a method of forming a helical RF inductor with metal or copper damascene coils that alternate in width from wide to narrow, wherein more coils can be formed and accommodated within the same area as a helical inductor with coils of uniform width fabricated according to the prior art. Said method is easily accomplished by strategically allocating metals within different intermetal dielectric (IMD) levels of an integrated microelectronics fabrication.

BRIEF DESCRIPTION OF THE DRAWINGS

FIGS. 3–10 provide a schematic depiction of the process steps involved in forming a helical inductor in accord with a first preferred embodiment of the method of the present invention.

DESCRIPTION OF THE PREFERRED EMBODIMENTS

Figure 1:
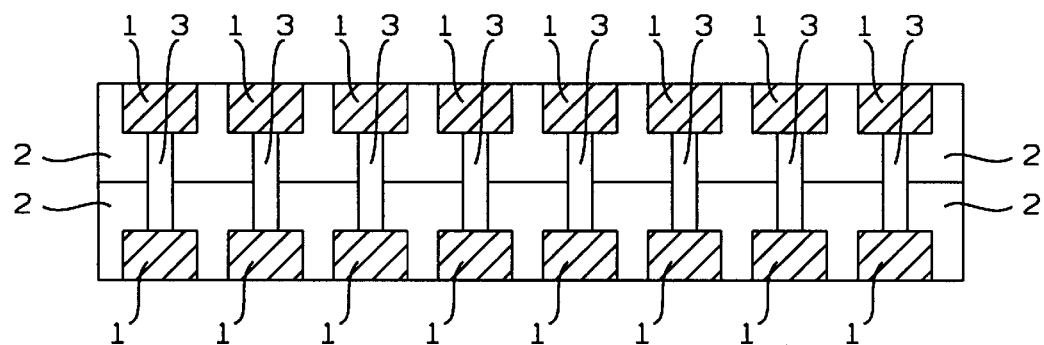
FIG. 1 is a schematic cross-sectional view of a helical inductor fabricated according to the prior art, showing the disposition of its coils.
Figure 2:
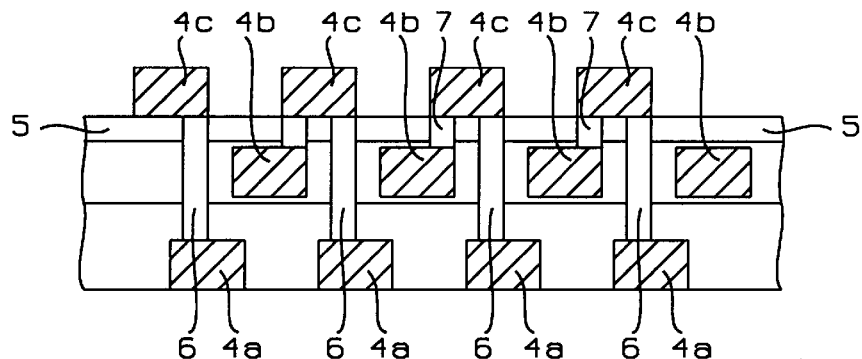
FIG. 2 is a schematic cross-sectional view of a helical inductor fabricated according to a first preferred embodiment the method of the present invention, showing the disposition of its coils and indicating the increase in the number of said coils made possible by said disposition.

The objects, features and advantages of the present invention are understood within the context of the Description of the Preferred Embodiments, as set forth below. The Description of the Preferred Embodiments is understood within the context of the accompanying figures. First Embodiment: Metal Coil Segments, Non-Damascene Process Referring first to FIGS. 1 and 2, there is seen in schematic cross-sectional view the essential difference between the helical formation of the prior art (FIG. 1) and that of the present invention (FIG. 2). In FIG. 1, disconnected linear segments of the coils (1) of the helical inductor formed according to the prior art are disposed along two inter-metal dielectric (IMD) layers (2) and are co-planar with those layers. The electrical continuity of the coils is achieved by interconnecting metal plugs (3) that cross from one IMD to the other, wherein each plug contacts an end of one linear portion on each layer. The resulting formation has coils of uniform width. In FIG. 2 there is seen in schematic cross sectional view the disposition of the helical coils (4) of the inductor provided by the present invention. By the interposition of an IMD layer (5) and the use of interconnecting metal plugs of two different lengths (6,7), one plug (6) passing between an upper coil segment (4c) and a lower coil segment (4a) and the other plug (7) passing between a middle coil segment (4b) and a lower coil segment (4a), a novel helical configuration with coils of alternate widths can be formed, that produces the same number of coils in a smaller area or, alternatively, a greater number of coils in the same area, while reducing capacitative coupling between said coils. This shape and the novel method of the formation of this inductor will be disclosed by referring to the next group of figures.

Figure 3:
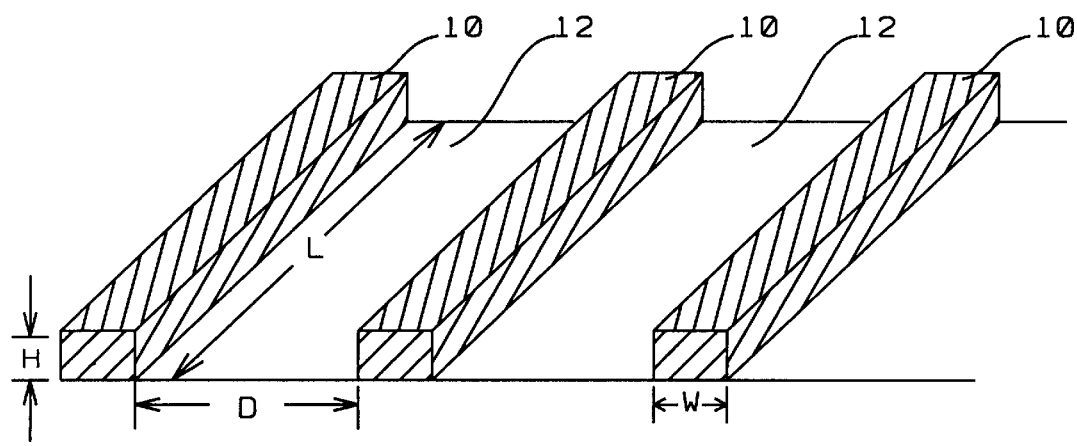

Referring next to FIG. 3, there is shown, in schematic form, a plurality of approximately equidistant parallel linear metal segments (10), equidistant from each other by a distance D of approximately 0.25 μm (microns), but which distance D can be made as large as possible, said segments having been formed on a substrate (12) by deposition through a first patterned photolithographic mask, using a method such as chemical vapor deposition (CVD), but which could also include such formation methods as electroplating or the spinning on of metal. Said metal segments can also be formed using a copper damascene process and the details of such a process will be disclosed in a second preferred embodiment by reference to subsequent figures within the description of said embodiment. It is also recognized that the distance D between segments of approximately 0.25 μm can be made smaller, as long as it does not violate design scales or constraints. The segments (10) have a width W, which is approximately 0.18 μm, a height H of between approximately 4,000 μm and 5,000 μm and a length L of approximately a few microns, depending upon circuit layout and routing. It is important to note that the relevant dimensions specified above might vary as a result of changes in the technology, layout, nature of the metal layers and the design scales.

Figure 4A:
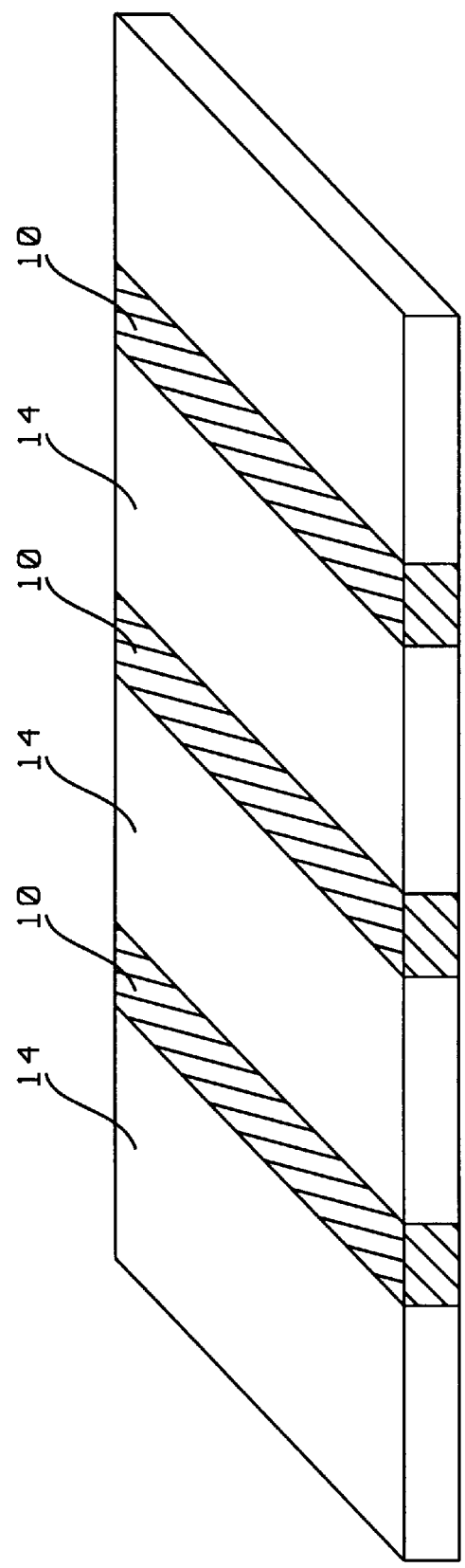

Referring next to FIG. 4, there is shown the fabrication of FIG. 3, in which a first inter-metal dielectric (IMD) layer of low dielectric constant material (low-K IMD) has been deposited (14) over the metal segments (10) to insure minimal capacitative coupling between the segments and then planarized by a method of chemical-mechanical polishing (CMP) to expose the metal segments. Typically, dielectric material such as FSG, HSQ, MSQ, SILK or FLARE, can be used, as well as any of several others chosen from among those commercially available materials well known to practitioners of the art. Said dielectric layers can be formed by a method such chemical vapor deposition (CVD) and said method will be used in the formation of all subsequent IMD layers.

Referring next to FIG. 5, there is shown the fabrication of FIG. 4, wherein a second low-K dielectric layer (16) has been deposited to a thickness of between 5000 microns and 8000 microns over the first dielectric layer (14) and has then been patterned and etched using a second photolithographic mask to form a plurality of equally spaced channels or trenches (18) equidistant from each other by a distance D of approximately 0.25 μm (microns), but which distance D can be made larger, said channels having an approximate width of 0.18 μm, a length L of approximately a few microns, depending upon circuit layout and routing and a thickness equal to the thickness of said dielectric layer. As can be seen in the figure, each of said trenches is positioned over the first dielectric layer between the metal segments (10) therein.

Referring next to FIG. 6, there is shown the fabrication of FIG. 5, wherein a layer of metal (20), which can be Cu or Al or another conducting species, has now been formed within each of the plurality of trenches etched in the second low-K inter-metal dielectric layer by a deposition process such as, but not limited to, CVD, spinning-on of metal or electroplating. Said layer of metal, shown here subsequent to surface planarization by a method such as chemical-mechanical polishing (CMP) thereby forms linear segments conforming to the shape of said etched trenches.

Figure 7:
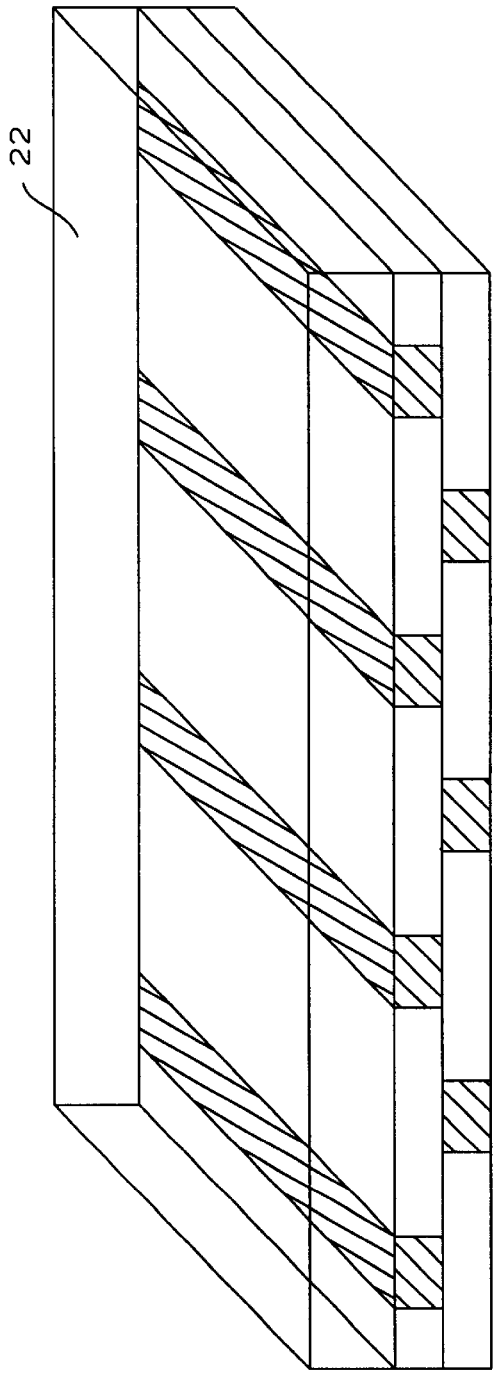

Referring next to FIG. 7, there is shown the fabrication of FIG. 6 on which a third low-K layer of dielectric (22) has been deposited to a thickness of between 5,000 μm and 8,000 μm.

Figure 8:
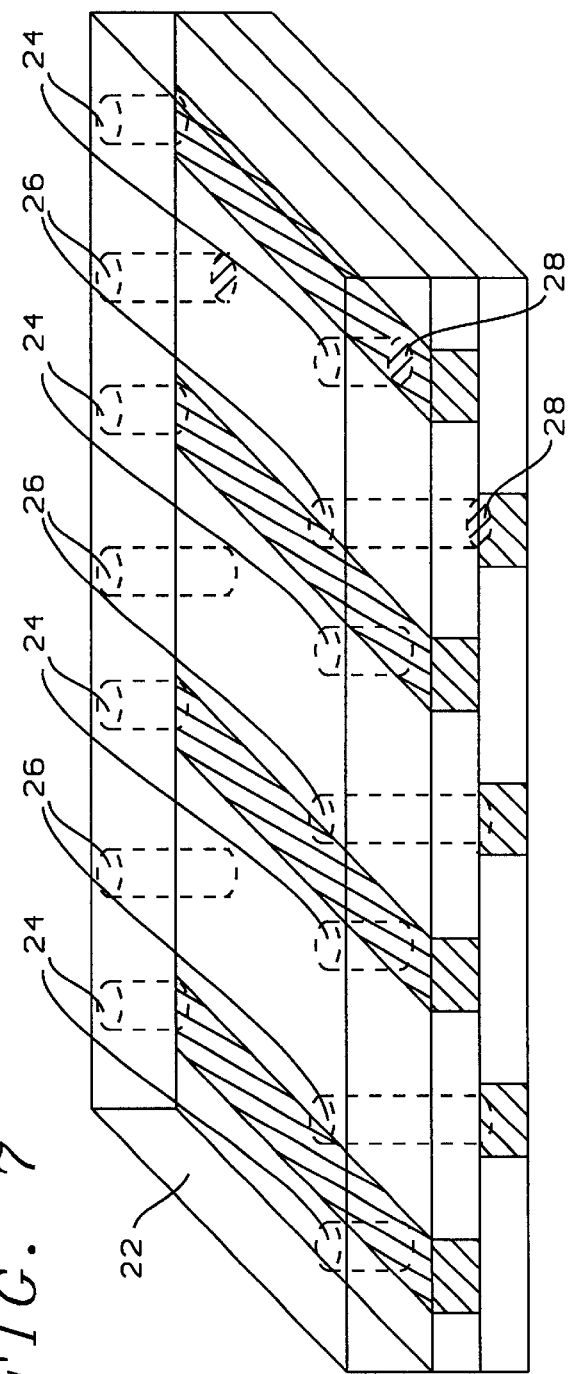

Referring next to FIG. 8, there is shown the fabrication of FIG. 7, which has now been patterned and etched using a third photolithographic mask to form two sets of cylindrical openings or via's, one set of which (24) penetrate the third low-K dielectric layer (22) and terminate on the opposite ends of the metal segments (20) formed in the second low-K dielectric layer, the other set of which (26) penetrate both the third (22) and second (16) low-K dielectric layers and terminate on opposite ends of the metal segments (10) formed within the first low-K dielectric layer. Both sets of said via's are then conformally filled with metal, by a method such as CVD or electroplating, to form conducting connections (28) to the metal segments at their terminations.

Figure 9:
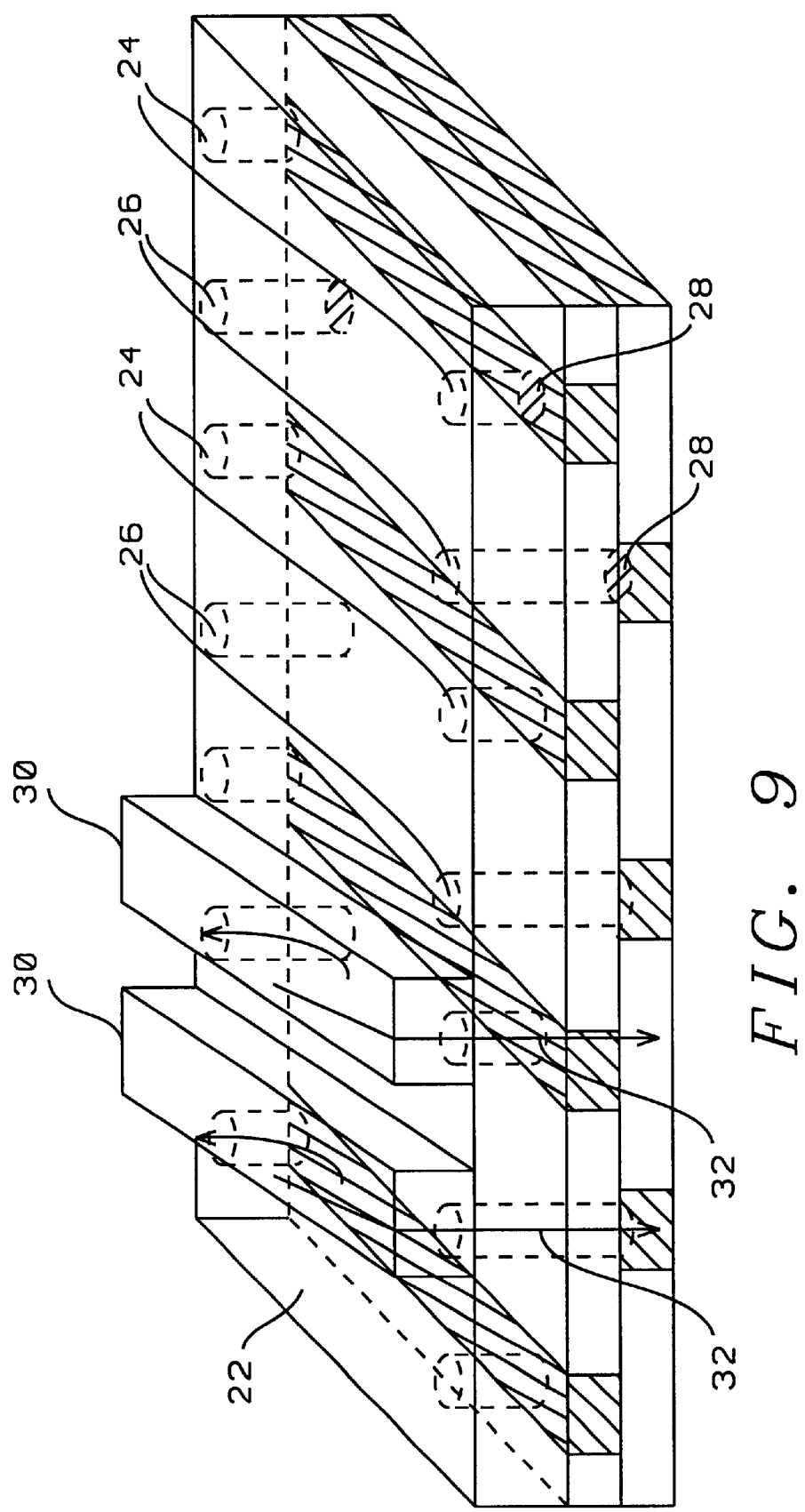

Referring next to FIG. 9, there is shown the fabrication of FIG. 8 wherein a plurality of linear metal segments (30) has been deposited through a fourth patterned photolithographic mask to form, thereby, a plurality of equally spaced, parallel metal segments on the third IMD layer, which segments, however, are not parallel to the metal segments formed in the first IMD layer (10) or the second IMD layer (20), but are obliquely disposed relative to them. Said newly formed linear metal segments (30) are formed with their ends making electrical contact with the filled vias (24) and (26) and are pitched at an angle relative to lower segments (10) and (20) so that they now complete a helical coil formation with conductive continuity. A series of arrows (32) indicate the current direction through the various levels of segments and their interconnecting vias.

Figure 10:
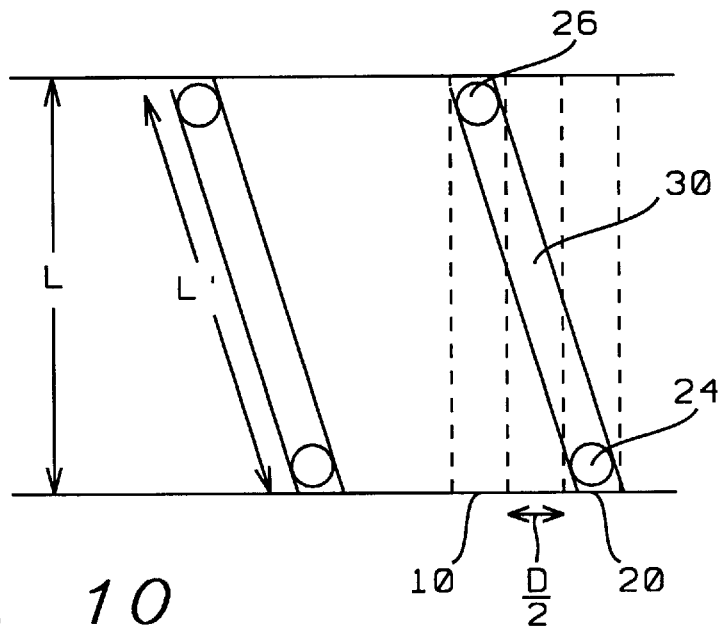

Referring finally to FIG. 10, there is shown an overhead view of the orientation of the plurality of obliquely disposed metal segments (30) relative to the two layers of metal segments (20) and (10) beneath them. As can be deduced from the geometry of the configuration, with the assumption that the middle segments (20) are approximately midway between the lower segments (10), the relationship between the length, L', of each oblique segment (30), the length L of each lower (and middle) segment and the distance, D, between said lower segments, is given by:

$$L'^2 = L^2 + (D/2)^2$$

Second Preferred Embodiment: Copper Damascene Coil Segments

If the metal segments comprising the helical RF inductor of the present invention are to be formed of copper, it is often advantageous to form them within lined trenches, said liner acting as a barrier to prevent the out-diffusion of the copper into the IMD layers. Such formations are called copper damascene formations and the method of their use in the fabrication of the helical inductor of the present invention can be seen by referring to the following figures.

Figure 11:
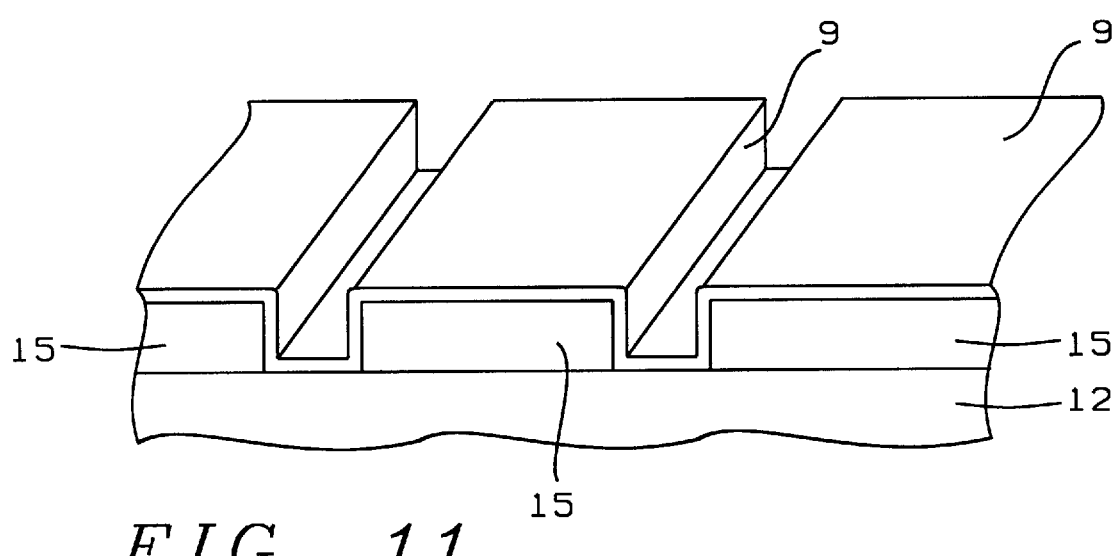
FIGS. 11–16 provide a schematic depiction of the process steps involved in forming a helical inductor in accord with a second preferred embodiment of the present invention, wherein the helical coils are formed by a copper damascene method.

Referring first to FIG. 11, there is shown a schematic diagram of an alternative process to the steps provided in FIG. 3 and FIG. 4, wherein the metal segments of the first layer of the helical coil are now formed according to a copper damascene process. In this alternative process methodology, which is also in accord with the objects and methods of the present invention, a first IMD layer (15) of low-K dielectric material such as FSG, HSQ, MSQ, SILK or FLARE, is deposited to a thickness of between 5,000 μm and 8,000 μm on a substrate (12) and a plurality of equidistant, parallel trenches (11) are formed within said layer through a patterned photoresist layer (not shown). The trenches are equidistant from each other by a distance D of approximately 0.25 μm, but said distance D can be made larger, said trenches having an approximate width of 0.18 μm, a length L of approximately a few microns, depending upon circuit layout and routing and a thickness equal to the thickness of said dielectric layer of the trenches disclosed Said trenches are then conformally lined with a barrier layer to lateral and downward copper diffusion, which could be formed of Ta/TaN or Ti/TiN(9).

Figure 12A:
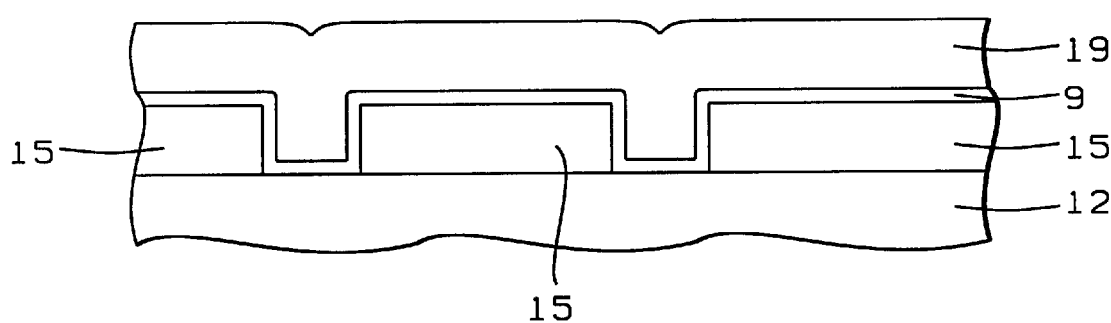

Referring next to FIG. 12a, there is shown the fabrication of FIG. 11 wherein a layer of copper (19) has now been deposited, by a method such as CVD, over the first IMD layer (15) and lined (9) trenches (11).

Figure 12B:
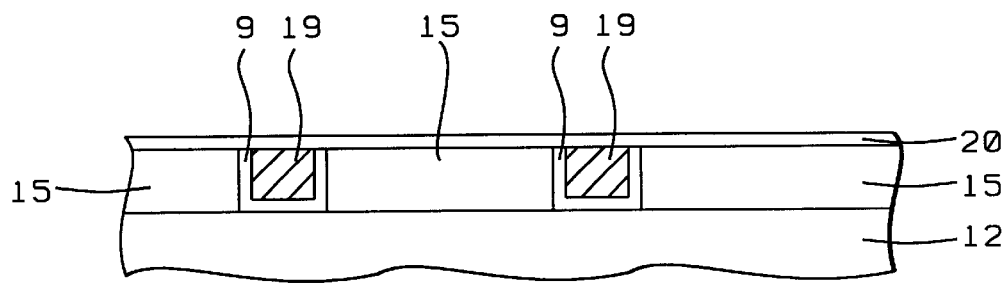

Referring to FIG. 12b, there is shown the fabrication of FIG. 12a, wherein the copper layer (19) has been removed by a planarization process such as CMP, leaving behind copper plugs (21) within the lined trenches. The resulting fabrication has then been covered by a thin layer (20) of material such as SiN, which will act as both a barrier layer to upward copper diffusion and as an etch-stop layer for use during trench formation in a second IMD layer subsequently deposited over said SiN layer and first IMD layer.

Figure 13:
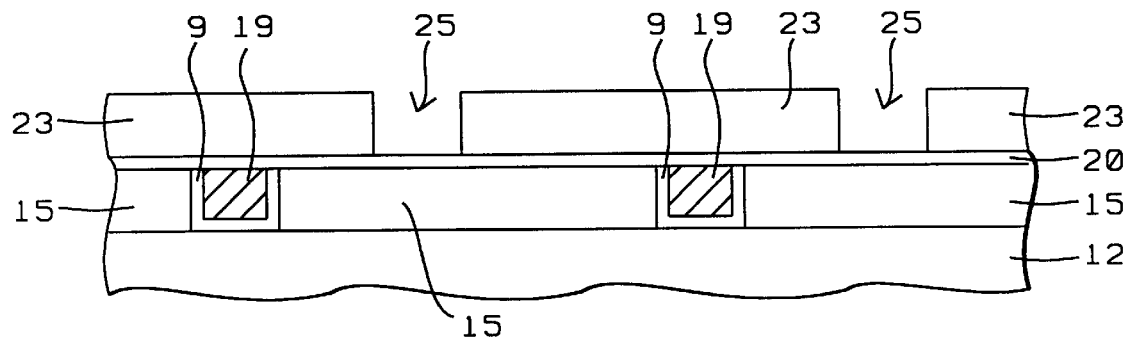

Referring next to FIG. 13, there is shown a second IMD layer (23) formed of the same low-K dielectric material as said first IMD layer, which said second IMD layer is deposited over the first IMD layer (15). A series of equidistant, parallel trenches (25) have been formed in said second IMD layer (23) that are identical in spacing and dimension to those formed in the said first IMD layer. Said trenches are formed through a patterned second photoresist layer (not shown) using an etch chemistry which is selective between the low-K dielectric material of said second IMD layer and the SiN barrier layer (20) previously formed over said first IMD layer. As can be seen in the figure, each of said trenches is positioned over the first dielectric layer between the metal segments (10) therein and does not penetrate the said SiN layer.

Figure 14:
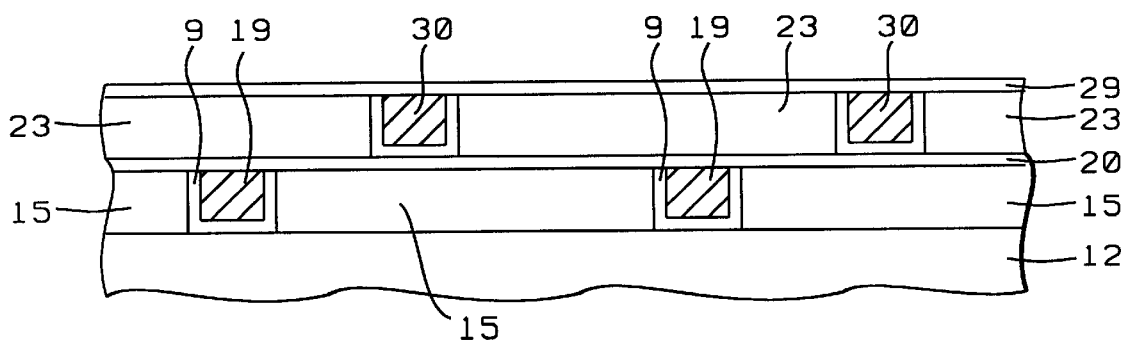

Referring next to FIG. 14, there is shown the fabrication of FIG. 13 wherein the trenches have been lined, covered with a layer of copper, planarized and covered with a layer of SiN (29), in exactly the same series of process steps outlined in the discussion of FIG. 12a and 12b above. The copper damascene segments are schematically shown (30).

Figure 15:
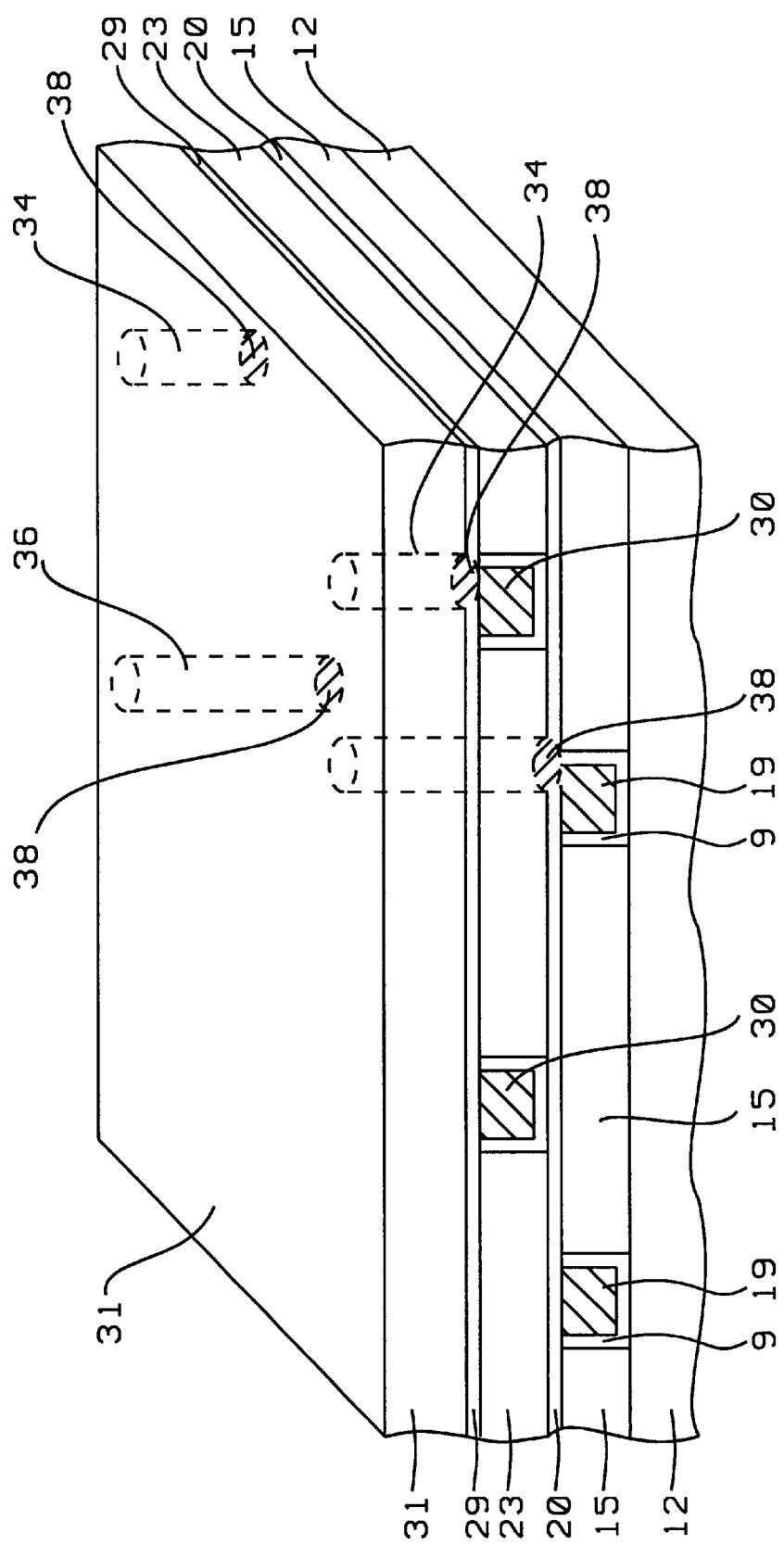

Referring next to FIG. 15, there is shown the fabrication of FIG. 14 wherein a third IMD layer (31) of identical material composition and dimension has now been deposited over said second IMD layer. Said third IMD layer has now been patterned and etched using a third photolithographic mask to form two sets of cylindrical openings or via's, one set of which (34) penetrate-the third low-K dielectric layer (31) and terminate on the opposite ends of the damascene segments (30) formed in the second IMD layer, the other set of which (36) penetrate both the third (31) and second (23) low-K IMD layers and terminate on opposite ends of the damascene segments (19) formed within the first low-K dielectric layer. It is important to note that the etch chemistry removes the SiN layer from the copper damascene segments to allow conductive contact between the metal filled vias and the said copper damascene coil segments. Both sets of said via's are then conformally filled with metal, by a method such as CVD or electroplating, to form conducting connections (38) to the metal segments at their terminations.

Figure 16:
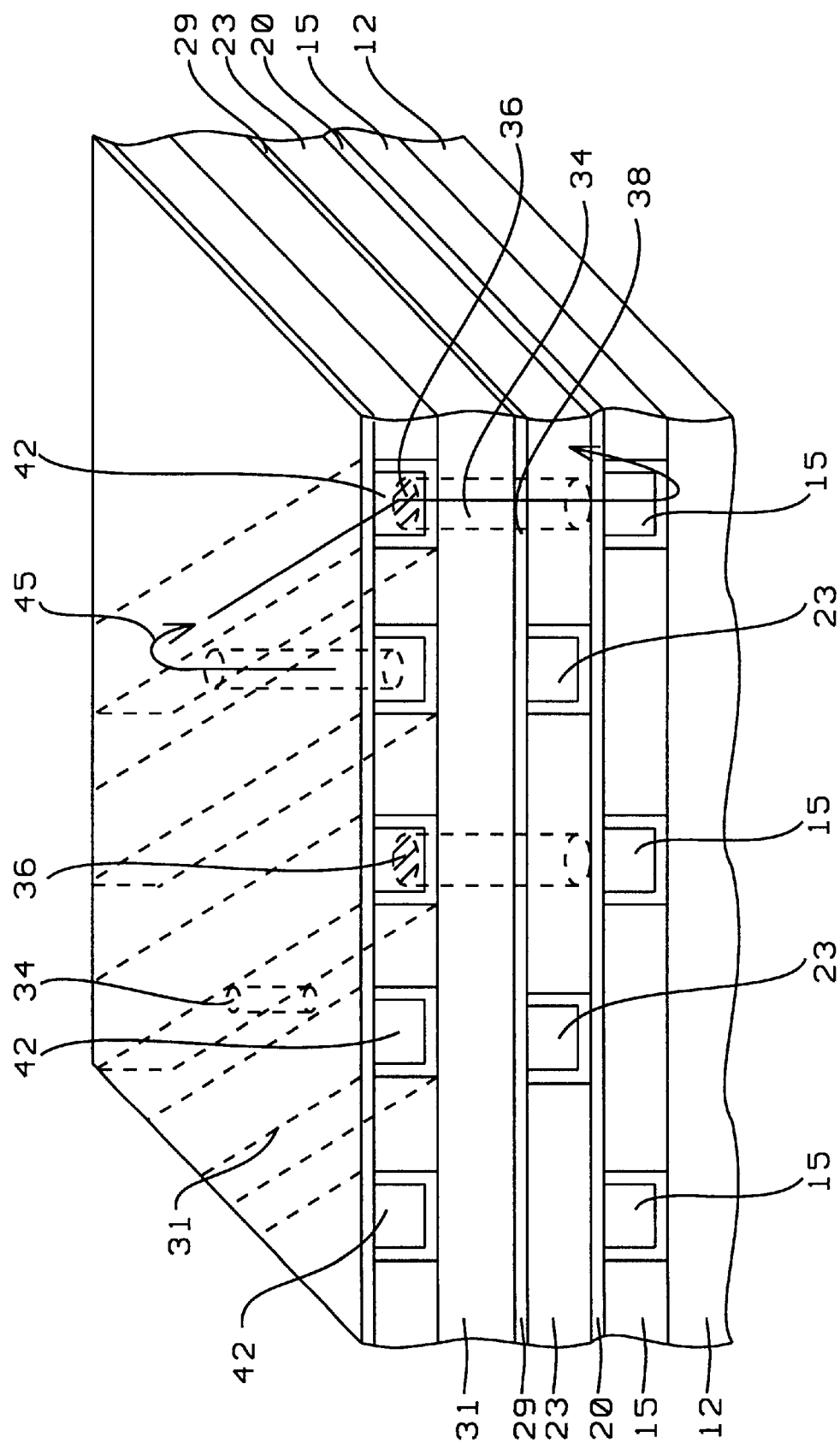

Referring next to FIG. 16, there is shown the fabrication of FIG. 15 wherein a fourth low-K IMD layer (40), identical to the third low-K IMD layer has been formed over the said third low-K IMD layer. Using a patterned fourth photoresist layer (not shown) a plurality of equally spaced, parallel trenches (42) is formed in the said fourth low-K IMD layer, which trenches, however, are not parallel to the copper damascene segments formed in the first IMD layer (15) or the second IMD layer (23), but are obliquely disposed relative to them. Said trenches are then lined with a barrier material in a manner identical to that set forth in the discussion of FIG. 11, covered with a layer of copper, planarized and covered with a layer of SiN in a manner identical to that set forth on the discussion of FIG. 12a and FIG. 12b, forming, thereby, a plurality of copper damascene segments (42). Said newly formed copper damascene segments (42) have their ends making electrical contact with the upper ends of the metal filled vias (34) and (36) and are pitched at an angle relative to lower segments (20) and (30) so that they now complete a helical coil formation with conductive continuity. A series of arrows (45) indicate the current direction through the various levels of segments and their interconnecting vias.

As is understood by a person skilled in the art, the preferred embodiments of the present invention are illustrative of the present invention rather than limiting of the present invention. Revisions and modifications may be made to methods, materials, structures and dimensions employed in fabricating an RF inductor with minimum area and high quality factor while still providing a method for fabricating such an RF inductor with minimum area and high quality factor in accord with the spirit and scope of the present invention as defined by the appended claims.

What is claimed is:

1. A method for fabricating an RF inductor with minimum area and high Q comprising:

providing a substrate;

forming on said substrate a plurality of parallel, equidistant linear conducting segments using a first patterned photolithography mask;

forming over said substrate and conducting segments a first layer of intermetal dielectric (IMD) material wherein said layer covers said conducting segments and conformally fills the spaces between them;

planarizing said first IMD to expose said linear conducting segments;

forming a second layer of IMD material over said planarized first layer of IMD material;

patterning and etching said second layer of IMD material using a second patterned photolithography mask so as to form a plurality of parallel equidistant trenches extending vertically to the surface of said first IMD layer, said trenches also being parallel to and dimensionally equivalent to the linear conducting segments within the first IMD layer and wherein each trench is positioned between a pair of said conducting segments formed in said first IMD;

forming a plurality of parallel conducting segments by depositing conducting material within said trenches formed in said second IMD layer;

planarizing said second IMD layer now containing said deposited conducting material segments;

forming on said planarized second IMD layer a third IMD layer;

planarizing said third IMD layer;

forming and patterning a third photolithography mask on said third IMD layer;

etching said third IMD layer through said third photolithography mask so as to form two sets of cylindrical vias, wherein one said set is positioned over opposite ends of the conducting segments formed within the second IMD layer and extends completely through said third IMD layer and the second said set is positioned over opposite ends of the metal segments formed within the first IMD layer and extends completely through the third IMD layer and the second IMD layer;

depositing conducting plugs within said vias so as to electrically contact said linear conducting segments formed within said first and second IMD layers;

forming and patterning a fourth photolithography mask over said third IMD layer;

depositing on said third IMD layer, through said patterned fourth photolithography mask, a plurality of parallel linear conducting material segments which are obliquely disposed relative to the conducting linear segments of the first and second IMD layers and wherein one end of each of said linear conducting material segments makes electrical contact with a conducting material filled via of one set of vias and the other end of said linear conducting material segment makes electrical contact with a conducting material filled via belonging to the other set of said vias in said third IMD and wherein said formation of linear conducting material segments thereby produces a continuous electrically conductive helical path.

2. The method of claim 1 wherein the conducting material forming the conducting segments deposited on the substrate is chosen from the group of metals comprising Cu, Al, Ta, and Au.

3. The method of claim 2 wherein the metal segments are deposited by a method such as chemical vapor deposition, spinning-on of metal or electroplating.

4. The method of claim 3 wherein the metal segments have a length, width and height that is design and layout dependent, but wherein a length of approximately 1 or 2 $\mu$m, a width of approximately 0.18 $\mu$m and a height of between 4,000 $\mu$m and 5,000 $\mu$m is acceptable within typical designs and layouts.

5. The method of claim 1 wherein the spacing between the metal segments is design and layout dependent but wherein a spacing of approximately 0.25 $\mu$m is acceptable within typical designs and layouts.

6. The method of claim 1 wherein the first intermetal dielectric (IMD) layer is a layer of low-K dielectric material chosen from a group of commercially available materials such as FSG, HSQ, MSQ, FLARE and Black Diamond and is deposited by a method of chemical vapor deposition (CVD) to a thickness of between 5,000 $\mu$m and 8,000 $\mu$m.

7. The method of claim 6 wherein the first low-K IMD layer is planarized by a method of chemical mechanical polishing (CMP).

8. The method of claim 1 wherein the second intermetal dielectric (IMD) layer is a layer of low-K dielectric material chosen from a group of commercially available materials such as FSG, HSQ, MSQ, FLARE and Black Diamond and is deposited by a method of chemical vapor deposition (CVD) to a thickness of between 5,000 $\mu$m and 8,000 $\mu$m.

9. The method of claim 1 wherein the trenches in the second intermetal dielectric (IMD) layer are etched to have a length, width, separation and height that is design and layout dependent, but wherein a length of approximately 1 or 2 $\mu$m, a width of approximately 0.18 $\mu$m, a separation of approximately 0.25 $\mu$m and a height of between 4,000 $\mu$m and 5,000 $\mu$m is acceptable within typical designs and layouts.

10. The method of claim 1 wherein the conducting materials deposited in the trenches formed in said second IMD are chosen from the group of metals comprising Cu, Al, Ta, and Au.

11. The method of claim 1 wherein the second IMD layer is planarized by a method of chemical mechanical polishing (CMP).

12. The method of claim 1 wherein the third intermetal dielectric (IMD) layer is a layer of low-K dielectric material chosen from a group of commercially available materials such as FSG, HSQ, MSQ, FLARE and Black Diamond and is deposited by a method of chemical vapor deposition (CVD) to a thickness of between 5,000 $\mu$m and 8,000 $\mu$m.

13. The method of claim 1 wherein the third low-K IMD layer is planarized by a method of chemical mechanical polishing.

14. The method of claim 1 wherein the conducting material deposited in said vias is metal chosen from the group of metals comprising Cu, Al, Ta and Au.

15. The method of claim 1 wherein each of the plurality of parallel conducting segments formed through said fourth photolithography mask has a length L' related to the length, L, of the conducting segments formed in the first and second IMD layers and the co-planar distance, D, between said conducting segments by the geometric relationship:

$$L'^2 = L^2 + (D/2)^2.$$

16. The method of claim 1 wherein the conducting material of the said parallel segments is a metal chosen from the group of metals comprising Cu, Al, Ta and Au.

17. A method for fabricating an RF inductor with copper damascene conducting coils, high Q and minimum area comprising:

providing a substrate;

forming on said substrate a first intermetal dielectric (IMD) layer;

forming in said first IMD layer a plurality of parallel, equidistant linear trenches using a first patterned photolithography mask;

forming in said trenches conducting segments having a copper damascene structure;

forming over said first IMD layer a first barrier/etch stop layer;

forming a second IMD layer over said first barrier/etch stop layer;

patterning and etching said second IMD layer using a second patterned photolithography mask so as to form a plurality of parallel equidistant trenches extending vertically to the surface of said first low-K IMD, said trenches also being parallel to and dimensionally equivalent to the now copper damascene filled linear trenches formed within the IMD layer and wherein each trench in said second IMD layer is positioned above and between a pair of said copper damascene metal segments;

forming a plurality of parallel copper damascene segments within said trenches formed in said second IMD layer;

forming over said second IMD layer a second barrier/etch stop layer;

forming over said second barrier/etch stop layer over said second planarized IMD layer a third IMD layer;

planarizing said third IMD layer;

forming and patterning a third photolithography mask on said third IMD layer;

etching said third IMD layer through said third photolithography mask so as to form two sets of cylindrical vias, wherein one set is positioned over opposite ends of the copper damascene segments formed within the second IMD layer and extends completely through said third IMD layer and through said second barrier/etch stop layer over said second IMD layer and the second set is positioned over opposite ends of the copper damascene segments formed within the first IMD layer and extends completely through said third IMD layer, said second barrier/etch stop layer, said second IMD layer and said first barrier/etch stop layer;

depositing conducting plugs within said vias so as to electrically contact said copper damascene segments within said first and second IMD layers;

forming a fourth IMD layer over said third IMD layer;

forming and patterning a fourth photolithography mask over said fourth IMD layer;

forming in said fourth IMD layer, by etching through said patterned fourth photolithography mask, a plurality of approximately equidistant parallel trenches obliquely disposed relative to said copper damascene segments formed in said first and second IMD layers;

forming copper damascene segments within said trenches wherein one end of each of said copper damascene segments makes electrical contact with a conductor filled via of one set of vias and the other end of said linear metal segment makes electrical contact with a conductor filled via belonging to the other set of vias formed in said third IMD and wherein said formation of linear copper damascene segments thereby produces a continuous electrically conductive helical path.

18. The method of claim 17 wherein the first intermetal dielectric (IMD) layer is a layer of low-K dielectric material chosen from a group of commercially available materials such as FSG, HSQ, MSQ, FLARE and Black Diamond and is deposited by a method of chemical vapor deposition (CVD) to a thickness of between 5,000 $\mu$m and 8,000 $\mu$m.

19. The method of claim 17 wherein said trenches formed in said first IMD layer have a length, width and height that is design and layout dependent, but wherein a length of approximately 1 or 2 $\mu$m, a width of approximately 0.18 $\mu$m and a height of between 4,000 $\mu$m and 5,000 $\mu$m is acceptable within typical designs and layouts.

20. The method of claim 19 wherein the spacing between said trenches is design and layout dependent but wherein a spacing of approximately 0.25 $\mu$m is acceptable within typical designs and layouts.

21. The method of claim 17 wherein the copper damascene segments are formed in said trenches formed in said first, second and fourth IMD layers in accord with the following steps, comprising:

depositing, conformally, within said trenches using a method such as CVD, a barrier/liner layer formed of a material impervious to copper diffusion;

forming over said IMD layer a copper layer, wherein said copper layer conformally fills said lined trenches and covers said IMD layer surface;

planarizing said copper covered IMD layer by a method of chemical mechanical polishing (CMP) to remove, thereby, said copper layer but to leave copper plugs remaining within said lined trenches.

22. The method of claim 21 wherein the barrier/liner layer is formed as a layer of either Ta/TaN, Ta—Si—N or Ti/TiN.

23. The method of claim 17 wherein the second intermetal dielectric (IMD) layer is a layer of low-K dielectric material chosen from a group of commercially available materials such as FSG, HSQ, MSQ, FLARE and Black Diamond and is deposited by a method of chemical vapor deposition (CVD) to a thickness of between 5,000 $\mu$m and 8,000 $\mu$m.

24. The method of claim 17 wherein the trenches in the second intermetal dielectric (IMD) layer are etched to have a length, width, separation and height that is design and layout dependent, but wherein a length of approximately 1 or 2 $\mu$m, a width of approximately 0.18 $\mu$m, a separation of approximately 0.25 $\mu$m and a height of between 4,000 $\mu$m and 5,000 $\mu$m is acceptable within typical designs and layouts.

25. The method of claim 17 wherein the third intermetal dielectric (IMD) layer is a layer of low-K dielectric material chosen from a group of commercially available materials such as FSG, HSQ, MSQ, FLARE and Black Diamond and is deposited by a method of chemical vapor deposition (CVD) to a thickness of between 5,000 $\mu$m and 8,000 $\mu$m.

26. The method of claim 17 wherein the conducting material deposited in said vias is metal chosen from the group of metals comprising Cu, Al, Ta and Au.

27. The method of claim 17 wherein the third IMD layer is planarized by a method of chemical mechanical polishing.

28. The method of claim 17 wherein the fourth intermetal dielectric (IMD) layer is a layer of low-K dielectric material chosen from a group of commercially available materials such as FSG, HSQ, MSQ, FLARE and Black Diamond and is deposited by a method of chemical vapor deposition (CVD) to a thickness of between 5,000 $\mu$m and 8,000 $\mu$m.

29. The method of claim 17 wherein each of the plurality of parallel trenches formed through said fourth photolithography mask has a length L' related to the length, L, of the conducting segments formed in the first and second IMD layers and the co-planar distance, D, between said conducting segments by the geometric relationship:

$$L'^2 = L^2 + (D/2)^2.$$

* * * * *